(12) United States Patent
Narita

(10) Patent No.: US 6,922,070 B2
(45) Date of Patent: *Jul. 26, 2005

(54) EVALUATING PATTERN FOR MEASURING AN EROSION OF A SEMICONDUCTOR WAFER POLISHED BY A CHEMICAL MECHANICAL POLISHING

(75) Inventor: Tadashi Narita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/834,063

(22) Filed: Apr. 29, 2004

(65) Prior Publication Data

US 2004/0201093 A1 Oct. 14, 2004

Related U.S. Application Data

(62) Division of application No. 10/254,645, filed on Sep. 26, 2002, now Pat. No. 6,774,660, which is a division of application No. 09/770,501, filed on Jan. 29, 2001, now Pat. No. 6,480,017.

(30) Foreign Application Priority Data

Sep. 22, 2000 (JP) ........................................ 2000-288451

(51) Int. Cl.$^7$ ...................... G01R 31/26; H01L 21/4763
(52) U.S. Cl. ...................... 324/765; 324/71.2; 324/699; 324/700; 257/752; 438/8
(58) Field of Search ................................. 324/750–765, 324/158.1, 71.2, 699, 700; 257/775, 752; 438/8

(56) References Cited

U.S. PATENT DOCUMENTS

| | | | |
|---|---|---|---|
| 5,723,874 A | 3/1998 | Baker et al. | |
| 5,890,951 A | 4/1999 | Vu | |
| 6,020,644 A | * 2/2000 | Tanigawa | 257/775 |
| 6,228,771 B1 | * 5/2001 | Allers | 438/692 |
| 6,480,017 B2 | * 11/2002 | Narita | 324/765 |
| 6,774,660 B2 | * 8/2004 | Narita | 324/765 |
| 2002/0125905 A1 | * 9/2002 | Borden et al. | 324/765 |

FOREIGN PATENT DOCUMENTS

| | | | |
|---|---|---|---|
| JP | 2000-021882 A | 1/2000 | |
| JP | 2000-058611 A | 2/2000 | |

* cited by examiner

Primary Examiner—Vinh Nguyen
Assistant Examiner—Emily Y Chan
(74) Attorney, Agent, or Firm—Volentine Francos & Whitt, PLLC

(57) ABSTRACT

An evaluating pattern includes a conductive pattern formed on a substrate, an insulating layer which is formed on the conductive pattern, a plurality of contact holes formed in a rectangular area through the insulating layer, and a conductive material filled into the contact holes to the conductive pattern.

20 Claims, 4 Drawing Sheets

EVALUATING PATTERN FOR MEASURING AN EROSION OF A SEMICONDUCTOR WAFER POLISHED BY A CHEMICAL MECHANICAL POLISHING

CROSS REFERENCE TO RELATED APPLICATIONS

This is a divisional application of application Ser. No. 10/254,645, filed Sep. 26, 2002 U.S. Pat. No. 6,774,660, which is a divisional application of application Ser. No. 09/770,501, filed Jan. 29, 2001, now U.S. Pat. No. 6,480,017, which are hereby incorporated by reference in their entirety for all purposes.

The present application claims priority under 35 U.S.C.§119 to Japanese Application No.2000-288451, filed on Sep. 22, 2000, which is hereby incorporated by reference in its entirety for all purposes.

BACKGROUND OF THE INVENTION

1. Field of the Invention

The present invention relates to an evaluating pattern for measuring an erosion of a semiconductor wafer polished by a chemical mechanical polishing method.

2. Description of the Related Art

A chemical mechanical polishing method (CMP method) has been used for forming a semiconductor device. As normally, a plurality of semiconductor devices are simultaneously formed on a semiconductor wafer, and such CMP method is applied on the semiconductor wafer.

In the case where the CMP method is applied for a damascene process, an erosion in a densely packed region where many contact holes or conductive lines are thick in a narrow distance may occur. The erosion is whereby a thickness of an insulating region in the densely packed region becomes thin by the CMP method, compared with a predetermined thickness. The reason reported is that a speed of polishing the insulating layer becomes faster in the densely packed region.

If the thickness of the insulating layer becomes thinner beyond a permissible range by the erosion, it is possible that an insulation is broken or a current leak occurs in the semiconductor device.

The semiconductor wafer which includes such semiconductor device having such excessive erosion is evaluated as a defective product by measuring the thickness of the insulating layer. A contact type device for measuring bumps which have occurred by the erosion is used for such measurement.

As the contact type device directly contacts with elements in the semiconductor device, it is possible to damage the elements. As a result, such damage may decline a yield of the semiconductor device.

SUMMARY OF THE INVENTION

An object of the present invention is to provide an evaluating pattern for measuring an erosion of a semiconductor wafer polished by a chemical mechanical polishing method.

To achieve the object, an evaluating pattern of one aspect of the invention is comprised of a conductive pattern which has a rectangular configuration, an insulating layer which is formed on the conductive pattern, and a conductive material filled into contact holes which are formed in the insulating layer on the middle of the conductive pattern.

According to the present invention, it is easy to recognize the evaluation pattern on a semiconductor wafer. As a measuring point is arranged in the middle of the rectangular conductive pattern, it is facile to identify the measuring point. That is, the measuring point in the middle of the rectangular conductive pattern is easily identified by recognizing sides of the rectangular conductive pattern.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood.

Figure 1A:
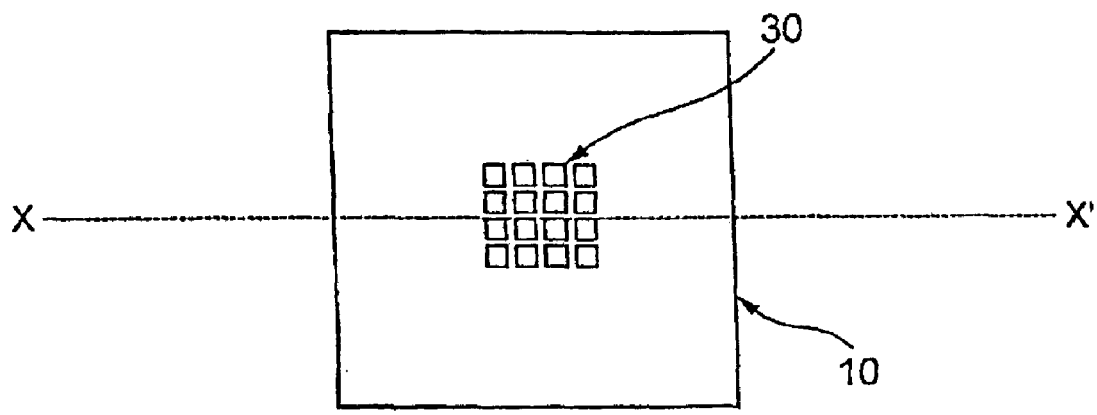
FIG. 1(a) is a plane view describing an evaluating pattern according to a first preferred embodiment.
Figure 1B:
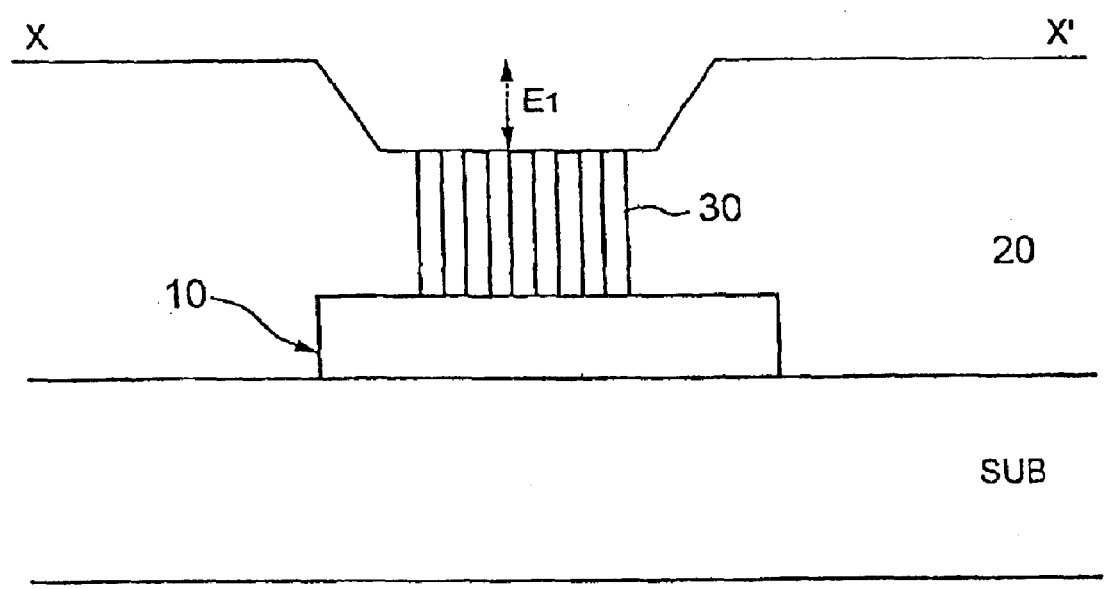
FIG. 1(b) is a cross section at a portion along line X–X' shown in FIG. 1(a).
Figure 2A:
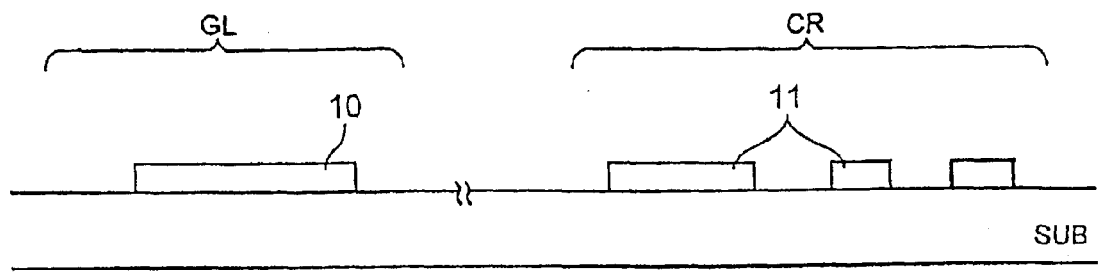
FIG. 2(a) to FIG. 2(c) are cross sections describing processes for forming the evaluating pattern shown in FIG. 1.
Figure 2B:
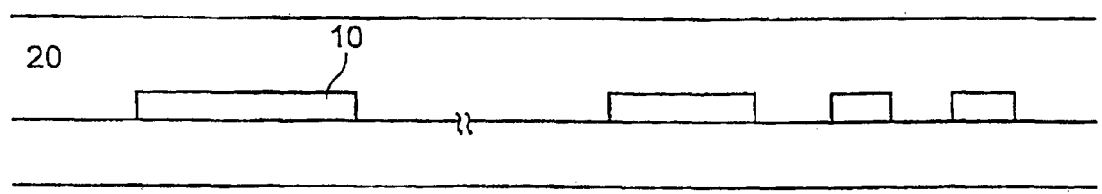
Figure 2C:
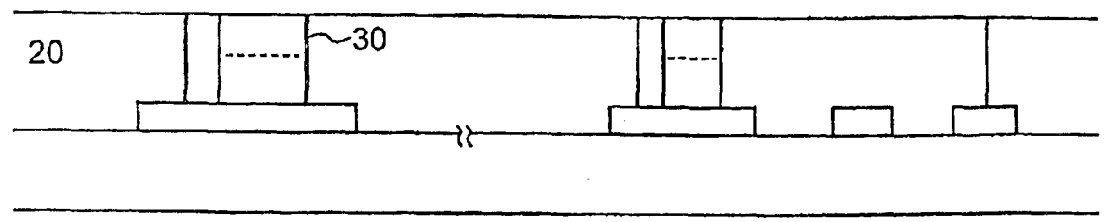

A first preferred embodiment is described hereinafter referring to FIGS. 1(a)–2(c). FIG. 1(a) is a plane view describing an evaluating pattern according to a first preferred embodiment. FIG. 1(b) is a cross section at a portion along line X–X' shown in FIG. 1(a). FIG. 2(a) to FIG. 2(c) are cross sections describing processes for forming the evaluating pattern shown in FIGS. 1(a) and 1(b).

The evaluating pattern is comprised of a rectangular conductive pattern 10, an intermediate insulating layer 20, and a conductive material 30 which is filled into contact holes formed in the insulating layer 20 on the middle of the conductive pattern 10.

The evaluating pattern is located on grid lines GL which partition off a semiconductor wafer SUB into chip regions CR where a plurality of semiconductor chips are formed thereon. That is, the chip regions CR are respectively divided on the semiconductor wafer SUB by the grid lines GL. If there is a space for the evaluating pattern in the chip regions CR, the evaluating pattern may be formed in the chip region CR.

The conductive pattern 10 is a rectangular configuration which is comprised of aluminum (Al). Naturally, other conductive materials can be applied for the conductive pattern 10. The conductive pattern 10 is formed on the grid line GR while conductive lines are formed in the chip regions CR, as shown in FIG. 2(a).

The intermediate insulating layer 20 is comprised of silicon dioxide (SiO2). The insulating layer 20 is not limited to a single layer, a multiple insulating layer can be used. For example, the multiple insulating layer is comprised of a silicon oxide layer which includes fluorine (SiOF) and a silicon dioxide layer (SiO2) which is formed on the silicon oxide layer which includes fluorine (SiOF). The insulating layer 20 is simultaneously formed on the chip regions CR and the grid lines GR, as shown in FIG. 2(b).

The conductive material 30 is comprised of a refractory metal or a compound made up of the refractory metal and other material, such as tungsten (W), titanium (Ti) and titanium-nitride (TiN). This conductive material 30 is filled into contact holes which are formed in the insulating layer 20, as shown in FIG. 2(c).

An erosion which occurs in the evaluating pattern is equivalent to an erosion which occurs in a densely packed region in the chip region CR. That is, the evaluating pattern shows an erosion that has occurred in the densely packed region where many contact holes or conductive lines are thick along a narrow distance in the chip region. Therefore, the erosion that has occurred in the chip region CR can be evaluated by measuring the erosion in the evaluating pattern.

The erosion in the evaluating pattern can be measured by a contact type device for measuring bumps that have occurred by the erosion. For example, the erosion is measured by scanning the device along line X–X' shown in FIG. 1(b).

In this embodiment, the contact holes are located on the middle of the conductive pattern 30 at a density of 25%. Each distance between the neighboring contact holes is substantially equal. The density can be designed by a designer to correspond to the density of contact holes or conductive lines in the chip regions. That is, the contact holes in the evaluating pattern are located according to the highest density in the chip regions CR. As the conductive pattern 10 is simultaneously formed with the conductive patterns in the chip region CR, a rectangular pattern which is similar to the conductive patterns in the chip region is suitable for the conductive pattern 10.

According to the first preferred embodiment, it is easy to recognize the evaluation pattern among many various patterns on a semiconductor wafer. As a measuring point is arranged in the middle of the rectangular conductive pattern, it is facile to identify the measuring point. That is, the measuring point in the middle of the rectangular conductive pattern is easily identified by recognizing sides of the rectangular conductive pattern. Further, in the case where the rectangular configuration of the conductive pattern is a square, as distance between the middle of the conductive pattern and one side is equal, a measurement from any direction is allowable. Therefore, the convenience or ease of the measurement can be improved.

Figure 3A:
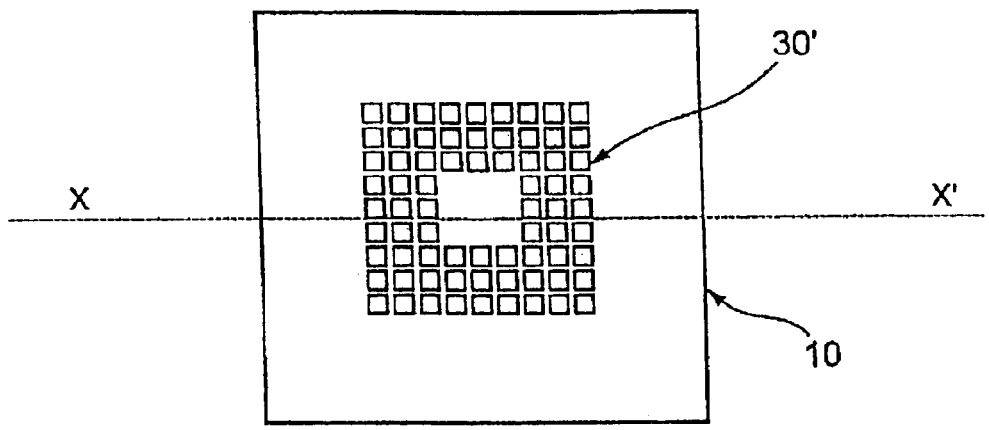
FIG. 3(a) is a plane view describing an evaluating pattern according to a second preferred embodiment.
Figure 3B:
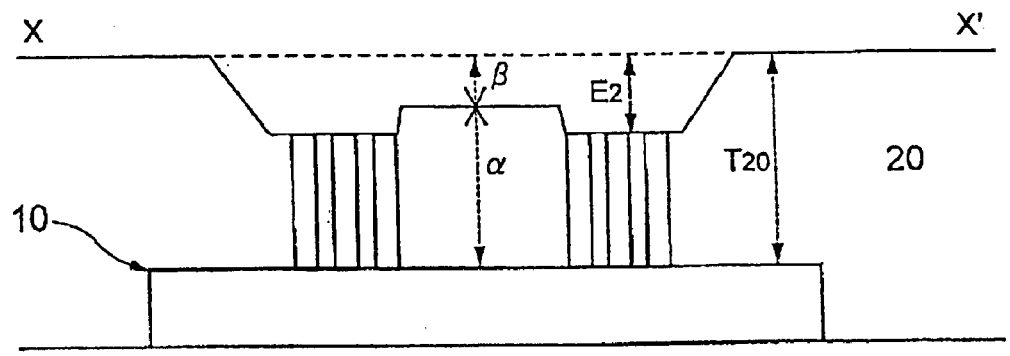
FIG. 3(b) is a cross section at a portion along line X–X' shown in FIG. 3(a).
Figure 4:
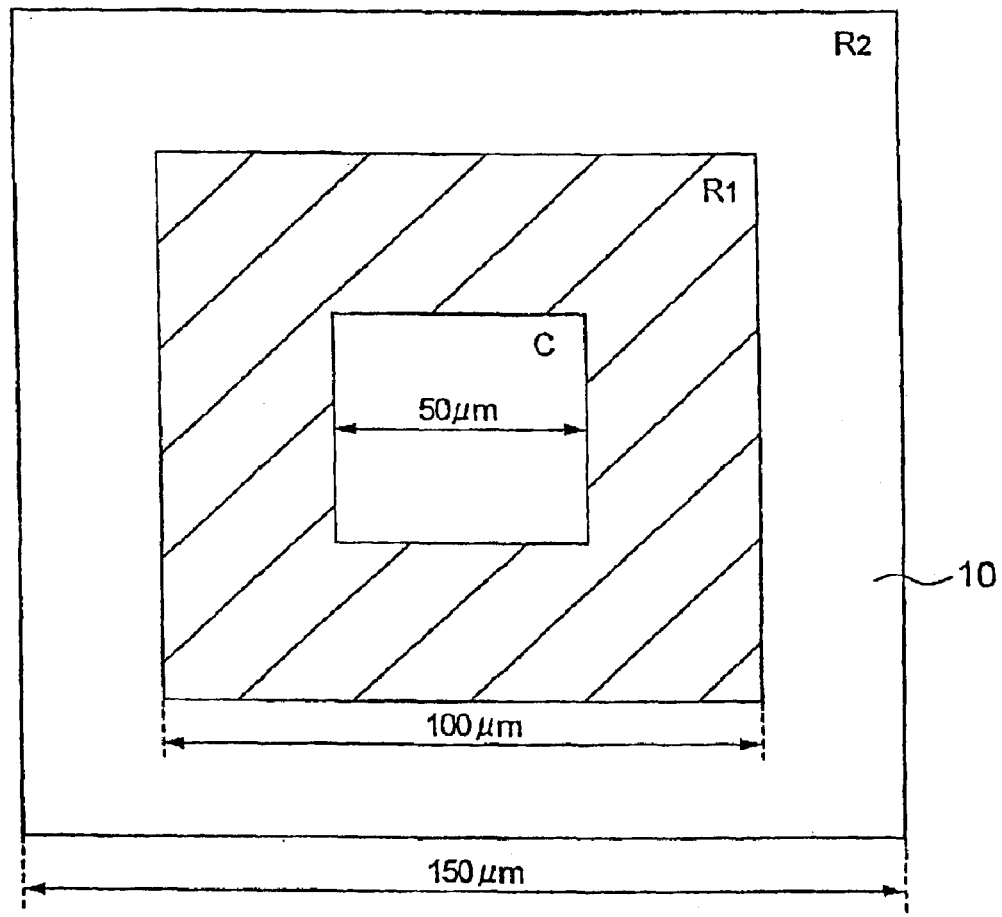
FIG. 4 is a plane view describing the evaluating pattern shown in FIG. 3.

A second preferred embodiment is described hereinafter referring to FIGS. 3(a)–4. FIG. 3(a) is a plane view describing an evaluating pattern according to a second preferred embodiment. FIG. 3(b) is a cross section at a portion along line X–X' shown in FIG. 3(a). FIG. 4 is a plane view describing the evaluating pattern shown in FIGS. 3(a)–3(b). The same elements mentioned above are marked at the same symbols and a description thereof is omitted.

The evaluating pattern of this embodiment is comprised of a rectangular conductive pattern 10, an intermediate insulating layer 20, and a conductive material 30 which is filled into contact holes formed in the insulating layer 20 on the middle of the conductive pattern 10. In this embodiment, an arrangement of the contact holes differs from that of the first preferred embodiment.

That is, the conductive pattern 10 has a central region C, a first region R1 which surrounds the central region C and a second region R2 which surrounds the first region R1, as shown in FIG. 4. In this embodiment, the length of one side in the central region C is 50 $\mu$m, the length of one side in the first region R1 is 100 $\mu$m and the length of one side in the second region R2 is 150 $\mu$m. These sizes are properly defined by a designer. If the length in the central region is comparatively long as in this embodiment, a popular optical device for measuring the erosion can be used. However, if the length in the central region is short, that is, the central region becomes narrow, a sophisticated optical device for measuring the erosion is necessary.

In this embodiment, the contact holes are formed in the insulating layer 20 in the first region R1. The conductive material 30 is filled into the holes. That is, the contact holes are not arranged in the central region C. Also, the contact holes are not arranged in the second region R2. The erosion does not occur in the second region R2. The contact holes, that is the conductive material 30, are symmetric with the central region C. Similar to the first embodiment, each distance between the neighboring contact holes is equal.

As the contact holes are not arranged in the central region C, it is difficult for an erosion to occur therein, compared with the first region R1. That is, some erosions may occur by the effect of the contact holes in the first region R1. However, since a dense arrangement is not provided in the central region C, an excessive erosion does not occur in the central region C.

Similarly, the evaluating pattern of this embodiment is located on the grid lines GL. Each element in this embodiment can be formed by the processes described in the first preferred embodiment.

Similarly, an erosion which occurs in the evaluating pattern is equivalent to an erosion which occurs in a densely packed region in the chip region CR. That is, the evaluating pattern shows an erosion that has occurred in the densely packed region where many contact holes or conductive lines are thick along a narrow distance in the chip region. Therefore, the erosion that has occurred in the chip region CR can be evaluated by measuring the erosion in the evaluating pattern.

In this embodiment, the erosion is evaluated by measuring thickness T20 of the insulating layer 20 in the second region R2 and thickness $\alpha$ of the insulating layer 20 in the central region C, using a non-contact type optical device. The optical device can measure thickness of bumps that have occurred by the erosion without contacting. The differential thickness $\beta$ is counted by the thickness T20 and the thickness $\alpha$. The erosion E2 is calculated by an interrelation between the differential thickness $\beta$ and the erosion E2. The interrelation is defined by a designer in advance.

Similar to the first embodiment, although direct measurement by the contact type device for measuring bumps that have occurred by the erosion can be applied in this embodiment, an indirect measurement is shown in this embodiment without using the contact type device.

The density of the contact holes in the first region R1 can be designed by a designer to correspond to the density of contact holes or conductive lines in the chip regions. That is, the contact holes in the evaluating pattern are located according to the highest density in the chip regions CR. As the conductive pattern 10 is simultaneously formed with the conductive patterns in the chip region CR, a rectangular pattern which is similar to the conductive patterns in the chip region is suitable for the conductive pattern 10.

According to the second preferred embodiment, in addition to the effect of the first preferred embodiment, an erosion that has occurred in the first region can be precisely measured by measuring the thickness of the insulating layer in the central region and the first region.

As the result, an evaluating pattern for measuring an erosion of a semiconductor wafer polished by a chemical mechanical polishing can be realized without declining a yield of the semiconductor device.

The present invention has been described above with reference to illustrative embodiments. However, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments that fall within the true scope of the invention.

What is claimed is:

1. An evaluating pattern comprising:

a semiconductor substrate:

an insulating layer formed on the semiconductor substrate;

a plurality of contact holes formed through the insulating layer in a rectangular area; and a conductive material filled into the contact holes, wherein the insulating layer has a first thickness in the rectangular area and has a second thickness greater than the first thickness in another area that does not include contact holes.

2. An evaluating pattern according to claim 1, wherein distances between the contact holes are substantially equal.

3. An evaluating pattern according to claim 1, wherein the insulating layer is formed of silicon oxide.

4. An evaluating pattern according to claim 1, wherein the evaluating pattern is formed on a grid line of the semiconductor substrate.

5. An evaluating pattern according to claim 1, wherein the semiconductor substrate has a conductive pattern formed in the rectangular area.

6. An evaluating pattern according to claim 1, wherein the conductive material includes at least one of tungsten, titanium and titanium nitride.

7. An evaluating pattern according to claim 1, wherein a density of the contact holes in the rectangular area is set to correspond to a density of an area in a chip region of the semiconductor substrate which has a greatest density of contact holes.

8. An evaluating pattern according to claim 7, wherein the density of the contact holes in the rectangular area is about 25%.

9. An evaluating pattern comprising:

a semiconductor substrate having a first rectangular area, a second rectangular area surrounding the first rectangular area and a peripheral area surrounding the second rectangular area;

an insulating layer formed on the semiconductor substrate;

a plurality of contact holes formed through the insulating layer in the second rectangular area, and not in the first rectangular area and the peripheral area; and a conductive material filled into the contact holes, wherein the insulating layer has a first thickness in the first rectangular area, a second thickness that is less than the first thickness in the second rectangular area, and a third thickness that is greater than the first thickness in the peripheral area.

10. An evaluating pattern according to claim 9, wherein distances between the contact holes are substantially equal.

11. An evaluating pattern according to claim 9, wherein the insulating layer is formed of silicon oxide.

12. An evaluating pattern according to claim 9, wherein the evaluating pattern is formed on a grid line of the semiconductor substrate.

13. An evaluating pattern according to claim 9, wherein the semiconductor substrate has a conductive pattern formed in the second rectangular area.

14. An evaluating pattern according to claim 9, wherein the conductive material includes at least one of tungsten, titanium and titanium nitride.

15. An evaluating pattern according to claim 9, wherein a density of the contact holes in the second rectangular area is set to correspond to a density of an area in a chip region of the semiconductor substrate which has a greater density of contact holes.

16. An evaluating pattern according to claim 15, wherein the density of the contact holes is about 25%.

17. An evaluating pattern according to claim 9, wherein the first rectangular area has a width of about 50 $\mu$m.

18. An evaluating pattern according to claim 9, wherein the second rectangular area has a width of about 100 $\mu$m.

19. An evaluating pattern comprising:

a semiconductor wafer having a plurality of chip regions and a grid line region separating the chip regions;

an insulating layer formed on the semiconductor wafer;

a plurality of contact holes formed through the insulating layer in a rectangular area; and a conductive material filled into the contact holes, wherein the insulating layer has a first thickness in the rectangular area and has a second thickness greater than the first thickness in an area that does not include contact holes.

20. An evaluating pattern according to claim 19, wherein the insulating layer is formed of silicon oxide.

* * * * *